United States Patent [19]

Hill et al.

[11] 4,284,867
[45] Aug. 18, 1981

[54] CHEMICAL VAPOR DEPOSITION REACTOR WITH INFRARED REFLECTOR

[75] Inventors: Lawrence Hill, Short Hills; Dennis Garbis, Dix Hills; Robert Heller, Levittown, all of N.Y.

[73] Assignee: General Instrument Corporation, Clifton, N.J.

[21] Appl. No.: 10,746

[22] Filed: Feb. 9, 1979

[51] Int. Cl.³ .................... H05B 6/42; C23C 13/08
[52] U.S. Cl. .................... 219/10.49 R; 219/10.75; 118/724; 118/620
[58] Field of Search .................... 219/10.49 R, 10.47, 219/10.43, 10.41, 10.75; 174/15 R; 427/45–57; 118/724, 725, 620, 625, 641, 642, 643; 156/610, 611, 612; 148/174, 175

[56] References Cited

U.S. PATENT DOCUMENTS

| | | | |
|---|---|---|---|
| 2,598,286 | 5/1952 | Mulder et al. | 219/10.79 |
| 3,067,278 | 12/1962 | Albright | 174/15 R |
| 3,160,517 | 12/1964 | Jenkin | 118/725 |
| 3,301,213 | 1/1967 | Grochowski et al. | 219/10.43 X |
| 3,699,298 | 10/1972 | Briody | 219/10.49 R |
| 3,845,738 | 11/1974 | Berkman et al. | 219/10.49 X |
| 4,115,163 | 9/1978 | Gorina et al. | 427/55 X |

FOREIGN PATENT DOCUMENTS 615067  8/1961  Italy ....................... 219/10.47

*Primary Examiner*—Elliot Goldberg
*Assistant Examiner*—Philip H. Leung
*Attorney, Agent, or Firm*—James & Franklin

[57] ABSTRACT

The reactor includes an R.F. induction coil, connected to a power supply, and located in proximity to the deposition enclosure. The coil radiates energy, a portion of which is converted by a susceptor situated in the enclosure into heat which is applied to the surface of the wafer adjacent thereto. A concave metallic infrared reflector redirects some of the normally unused radiated energy, in the form of radiant heat, onto the external surface of the wafer to promote even heating and, thus, reduce temperature gradients in the wafer thereby eliminating detrimental dislocation motion or slip. Moreover, the input power requirements of the system are reduced. Preferably, the enclosure is cooled by spraying de-ionized liquid thereon to eliminate unwanted deposition of dopants on the interior surface thereof.

1 Claim, 4 Drawing Figures

CHEMICAL VAPOR DEPOSITION REACTOR WITH INFRARED REFLECTOR

The present invention relates to chemical vapor deposition reactors and, more particularly, to a chemical vapor deposition reactor wherein normally unused radiated energy is utilized to reduce the power requirements of the system and eliminate slip in the wafter.

Induction heated vapor deposition reactors typically include a deposition enclosure (such as an epitaxial quartz tube or a bell jar) having disposed therein a wafer mounted on a susceptor. Energy is radiated by the electrically uninsulated turns of an R.F. induction coil disposed about the enclosure. As current is passed through the coil turns, the coil induces heating of the susceptor which, in turn, heats the wafer mounted thereon to a temperature sufficient to cause the gas passing through the deposition enclosure to deposit epitaxially on the wafer.

When an induction heated reactor is heated, the susceptor first becomes warm and it, in turn, heats the wafer by a combination of conduction, radiation and convection heat transfer. However, regardless of how slowly the susceptor is heated, there is always a temperature gradient through the wafer thickness due to the fact that the wafer is heated from one side by a nearby high temperature. The wafers warp to a dish shape, such that the outer rim of the wafer is displaced from the susceptor surface, causing uneven heating because the outer rim of the wafter is heated less than the center. This radial temperature gradient results in stresses which cause significant dislocation motion or slip. The resulting stress is greater the higher the temperature and the larger the wafer.

The slip problem can be circumvented through the use of a heat source which heats the wafer directly. This may be accomplished by substituting high intensity tungsten-halide lamps as a heat source instead of an R.F. induction coil. Such lamps radiantly heat the wafers directly and with the proper selection of power, lamp spacing and rotation, virtually no unwanted dislocation motion occurs.

However, while radiantly heating the wafer has the desirable result of eliminating gross dislocation motion caused by temperature gradients, the use of such apparatus is not practical due to the very high initial capital equipment costs and the high operating costs of same. The amount of radiant heat which must be generated for satisfactory operation of the reactor requires the use of prohibitively expensive equipment which is very costly to operate. For these reasons, radiantly heated chemical deposition reactors have not been considered as a practical alternative for commercial situations requiring high production at minimum cost per wafer.

Whether the wafer is heated directly by a radiant heat source or indirectly through the susceptor by an R.F. induction coil, other problems are created. Directing energy towards the enclosure tends to heat the walls of the deposition enclosure, thereby promoting the deposit of gases passing through the deposition enclosure upon the interior walls of the deposition enclosure. Such deposits on the interior walls of the deposition enclosure have a deleterious effect on the quality of the material being grown within the deposition enclosure by promoting the development of spikes, pits, and various other surface defects. Furthermore, the deposits include dopants from a given run, in which case the deposits may act, in future consecutive runs, as an upwanted source of dopants.

In order to prevent such deposits from forming, it is customary to cool the deposition enclosure. Any of a variety of known techniques may be used to obtain this result. For example, fluids such as air, nitrogen or deionized water may be directed in a cooling stream onto the exterior of the deposition enclosure to absorb and remove heat therefrom. Alternately, all of the surfaces in the reactor may be coated with a black material to absorb heat losses.

Thus, in order to avoid deposition or coating of the deposition enclosure, it was generally considered necessary to continuously remove excess heat from the reactor. Heat removal is performed even though the removal of heat increases initial capital equipment investment costs, because larger power supplies are required, as well as increasing operational costs, because larger amounts of high cost electricity are necessary to operate the reactor. Moreover, obtaining and operating the equipment necessary to cool the reactor further increases the capital and operating costs.

Solar cells, which convert sunlight directly into electricity, may be fabricated on wafers grown in conventional chemical vapor deposition reactors, both of the induction heated and radiantly heated types. However, the high initial capital equipment investment costs and high operating costs of such reactors have heretofore made the wafers grown therein and, thus, the solar cells fabricated therefrom, too expensive for practical purposes. Because of ever increasing energy costs for conventional fuels and the threats of shortages of oil and natural gas, the importance of developing methods of producing solar cells inexpensively has increased dramatically in recent years.

It is, therefore, a prime object of the present invention to provide a chemical vapor deposition reactor which operates with increased efficiency.

It is a second object of the present invention to provide a chemical vapor deposition reactor with an infrared reflector wherein normally unused energy is effectively utilized.

It is a third object of the present invention to provide a chemical vapor deposition reactor with an infrared reflector wherein initial capital equipment costs are reduced by permitting utilization of power supply sources of reduced size.

It is a fourth object of the present invention to provide a chemical vapor deposition reactor with an infrared reflector wherein the operating costs of the system are greatly reduced.

It is a fifth object of the present invention to provide a chemical vapor deposition reactor with an infrared reflector wherein input power requirements of the system are greatly reduced.

It is a sixth object of the present invention to provide a chemical vapor deposition reactor with an infrared reflector wherein temperature gradients in the wafer material, caused by induction heating, are greatly reduced, eliminating material strain which results in dislocation motion or slip.

It is a seventh object of the present invention to provide a chemical vapor deposition reactor with an infrared reflector which eliminates the necessity for the use of high cost radiant heating sources.

It is another object of the present invention to provide a chemical vapor deposition reactor with an infrared reflector wherein unwanted deposition on the enclosure wall is reduced by spraying de-ionized liquid directly onto the exterior surface of the enclosure.

It is a further object of the present invention to provide a chemical vapor deposition reactor with an infrared reflector which utilizes an induction coil, but which prevents slip in the same manner as the more expensive radiantly heated reactor.

It is a still further object of the present invention to provide a chemical vapor deposition reactor with an infrared reflector wherein energy radiated from the induction coil is more effectively utilized by converting same into radiant heat which is focused on the wafer.

In accordance with the present invention, a method and apparatus for increasing the efficiency of a chemical vapor deposition reactor is provided. The reactor includes a deposition enclosure adapted to receive a wafer mounted on a susceptor therein. The enclosure is provided with gas inlet and gas outlet ports. A source of deposition gas is connected to the gas inlet port. An R.F. induction coil, located external to the enclosure and operably connected to a power source, is provided for radiating energy. A part of the radiated energy induces the susceptor to heat the wafer and the remainder of the radiated energy is directed away from the enclosure and, thus, normally unutilized. Means are provided for redirecting at least a portion of the normally unutilized energy towards the wafer to heat same.

The redirecting means comprises a high emissivity metallic infrared reflector having a concave configuration designed to focus the redirected energy on the enclosure. The reflector includes a frame supporting a molybdenum reflecting surface, which faces the enclosure. The exterior surface of the reflector is composed of aluminum. Insulating material, formed of quartz wool or the like, is situated between the surfaces.

The reflector captures a large percentage of the normally unutilized energy radiated from the R.F. induction coil, redirects and focuses this energy, in the form of radiant heat, on the external surface of the wafer. In this manner, the wafer is heated from both surfaces simultaneously. The surface adjacent the susceptor is heated by the susceptor and the surface facing away from the susceptor is heated by the reflected radiant heat. By heating both wafer surfaces simultaneously, the temperature gradients normally caused in an induction heated reactor are eliminated. Elimination of the temperature gradients prevents thermal stress in the wafer which is the cause of gross dislocation motion or slip and enhances the quality of the end product.

The use of the reflector of the present invention also eliminates the necessity for the use of radiant heat sources which can be substituted for the R.F. induction coil to prevent slip. This is a great advantage because such radiant heat sources are extremely expensive and, thus, render the reactor commercially impractical.

Means for cooling the surface of the enclosure is also preferably provided. The cooling means comprises means for spraying de-ionized liquid having a resistivity of at least 14 megohms-centimeter onto the exterior surface of the enclosure.

Moreover, the use of the reflector assembly increases the efficiency of the reactor by permitting the effective utilization of heretofore unusable energy so as to reduce operating costs by decreasing the amount of high-cost electricity which is required to operate the reactor. In addition, the reflector reduces the initial capital equipment investment by reducing the input power requirements and, therefore, smaller, less costly power supply sources may be used. Furthermore, when used in conjunction with the spray means for cooling the exterior of the deposition enclosure, the system also eliminates unwanted deposition on the interior walls of the deposition enclosure.

To the accomplishment of the above, and to such other objects which hereinafter appear, the present invention relates to a chemical vapor deposition reactor with infrared reflector, as set forth in the following specification and recited in the annexed claims, taken together with the accompanying drawings, wherein like numerals refer to like parts and in which:

Figure 1:
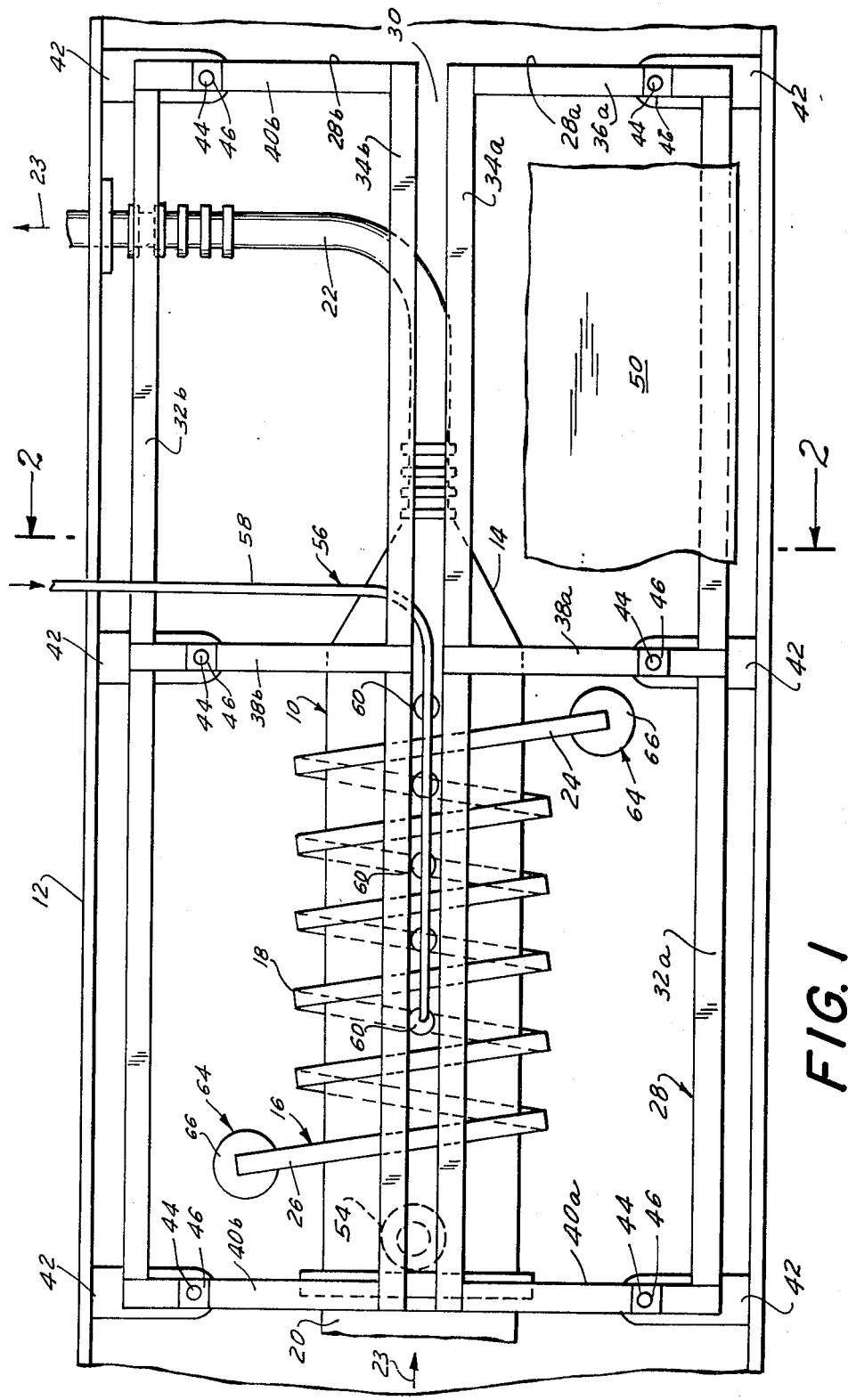
FIG. 1 is a top view of a reactor of the present invention with a part of reflector surface cut away to illustrate the frame structure.
Figure 2:
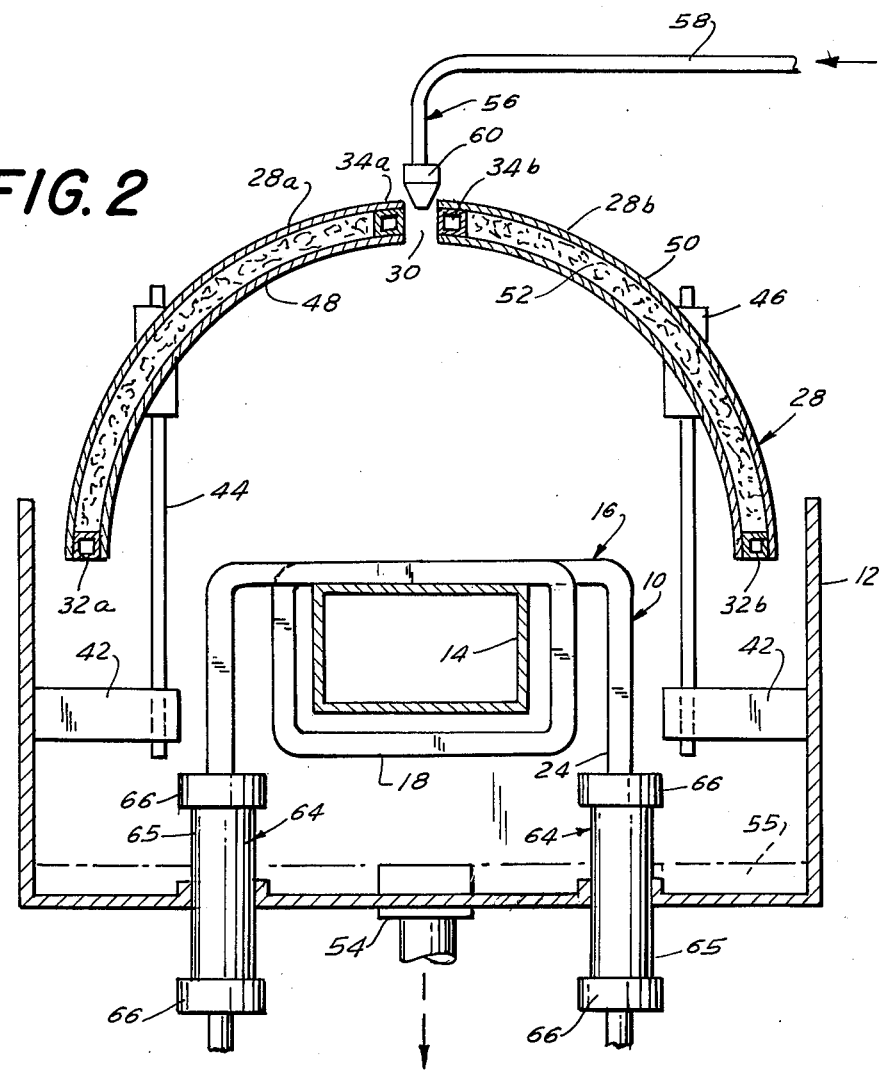
FIG. 2 is a cross-sectional view of the reactor shown in FIG. 1, taken along line 2—2 of FIG. 1.
Figure 3:
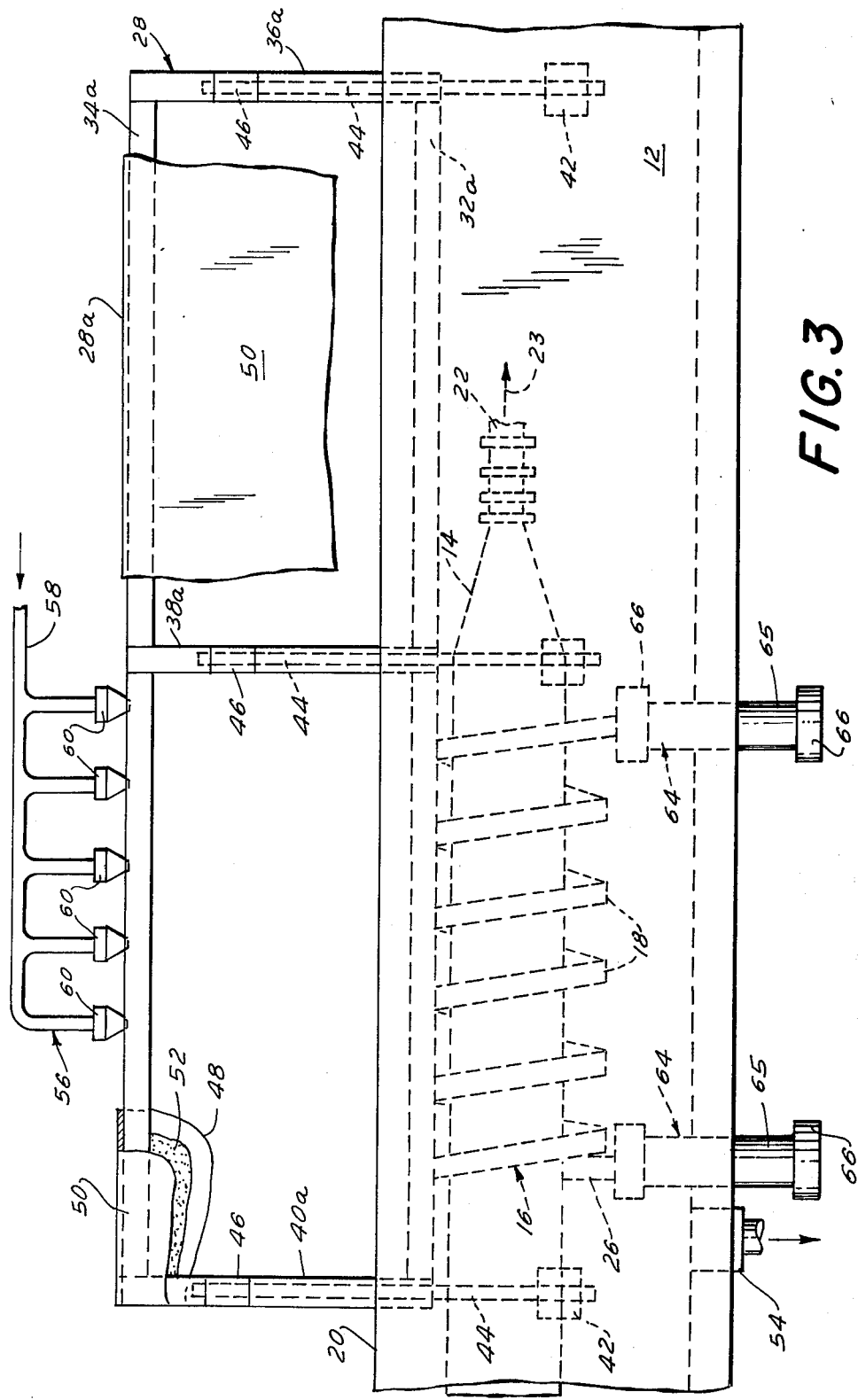
FIG. 3 is a side view of the reactor of the present invention shown in FIG. 1.

Referring now to the drawings, and, in particular, to FIGS. 1, 2 and 3 thereof, therein illustrated is a preferred embodiment of the present invention comprising a chemical vapor deposition reactor of the induction heated type, generally designated 10. The apparatus 10 is mounted in an open-topper receptacle or pan 12 adapted for the receipt of fluid and includes a deposition enclosure 14, such as a horizontal quartz epitaxy tube, or the like. Disposed about deposition enclosure 14 is an internally water-cooled R.F. induction heating coil 16 having turns 18.

An inlet conduit 20 is provided to feed the gases necessary for crystal growth to the inlet end of deposition enclosure 14. An outlet conduit 22 is connected to the outlet end of the deposition enclosure 14 to remove the unused gases, such that gases flow through the enclosure in the direction of arrows 23.

Appropriate spacers (not shown), formed of an electrically insulating material, are employed to maintain the spacing of the coil turns 18. One end 24 of the R.F. induction coil 16 is connected to a power source, such as an R.F. generator (not shown), and the other end 26 of the coil is connected to ground. Situated within the deposition enclosure 14 is a wafer carrier or susceptor (not shown) which is tuned to the oscillator circuit of the generator. Mounted on the susceptor is a wafer (also not shown) upon which the epitaxial growth will take place.

Located above induction coil 16 is a reflector assembly, generally designated 28. Reflector 28 is a high emissivity metallic infrared reflector having a concave configuration. Reflector 28 preferably comprises two parts 28a, 28b, separated along the axis of the reactor by a space 30, the purpose of which is disclosed below. Reflector 28 acts to redirect and focus energy radiated by induction coil 16, in the form of radiant heat, towards the enclosure to heat the wafer therein.

When viewed edgewise, as in FIG. 2, reflector 28 has a generally semicircular configuration, each of the portions 28a, 28b, having a curvature of an arc of approximately 90°. Each of the reflector sections 28a, 28b comprises a frame including horizontal side members 32a, 32b, respectively, horizontal top members 34a, 34b, respectively, and three arcuate struts or rib members 36a, 36b; 38a, 38b; and 40a, 40b, respectively, connecting the side and top members. The frame members are preferably composed of aluminum for lightness and strength.

Each of the rib members 36a, 36b; 38a, 38b; 40a, 40b are supported by a separate mounting bracket extending from and affixed to an interior wall of pan 12. Each of the mounting brackets comprise a horizontally extending member 42 upon which an upstanding rod 44 is mounted. Situated near the top of each of the upstanding rods 44 is an insulating member 46 upon which the respective reflecting parts 28a, 28b are mounted.

Figure 4:
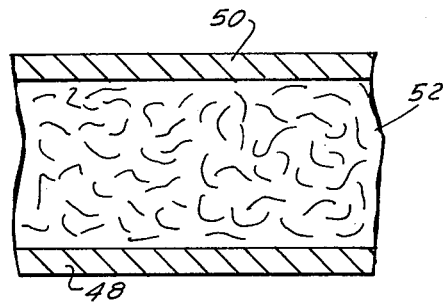
FIG. 4 is a cross-sectional view showing the structure of the reflector.

The structure of the reflector itself is best illustrated in FIGS. 2 and 4, which show the reflector in cross-section. Each of the reflector parts 28a, 28b is composed of an interior sheet 48 of a polished molybdenum approximately 0.01 inch thick, which is affixed to the underside of the frame members. The exterior of the reflector is a thin sheet of aluminum 50 which is affixed to the outer surface of the frame members. Located in the space between sheets 48, 50 is situated an insulating material 52, such as quartz wool or the like. Thus, in cross-section, each reflector part appears to be a sandwich of insulating material 52 between an interior sheet 48 and an exterior sheet 50.

A means for cooling the deposition enclosure 14 is provided in order to prevent deposition of dopants on interior wall of the enclosure. This cooling apparatus is preferably a spray system such as is described in detail in co-pending application Ser. No. 953,575, entitled "Method of Cooling Induction Heated Vapor Deposition Apparatus And Cooling Apparatus Therefor," filed on Oct. 23, 1978 in the names of the inventors herein and assigned to the assignee hereof. As described in that application, pan 12 is preferably mounted in an electrically grounded frame (not shown) and is provided with an electrically insulated drain 54 which maintains the level of the fluid 55 in the pan 12 at about an inch above the pan bottom and discharges the excess to waste.

A sprayer system, generally designated 56, is disposed above the deposition apparatus 10. The sprayer system 56 comprises a liquid inlet conduit 58 having a plurality of nozzles 60 located in the space 30 between reflector parts 28a and 28b. Nozzles 60 are adapted to spray liquid on the top of the apparatus and, more particularly, on the deposition enclosure 14 and coil turns 18. The sprayer system 56 and, more particularly, conduit 58 is connected to a source of de-ionized liquid, preferably de-ionized water, having a resistivity of at least 14 megohms-centimeter, the source being adapted to introduce the de-ionized fluid of given resistivity through the conduit 58 and, hence, through nozzles 60 onto the apparatus 10.

The requirement that the de-ionized liquid have a resistivity of at least 14 megohms-centimeter, preferably 14–18 megohms-centimeter, is based on the assumption that the path of the dispensed de-ionized fluid along the deposition enclosure and the R.F. coil is uncontrollable and, at one time or another, the dispensed spray may constitute an electrical path exposed to the full power of the R.F. source (for example, 16 kilovolts). The de-ionized (i.e., de-mineralized) nature of the fluid being sprayed onto the deposition apparatus precludes the formation on the outer wall thereof of mineral deposits which might affect local cooling and, eventually, require shutdown of the apparatus for deposit removal. Inasmuch as the ends 24, 26 of the R.F. coil 16 pass through the bottom of receptacle 12, and there will be a shallow reservoir of fluid 55 lying atop the bottom of the pan 12, each end of the R.F. coil is shielded from the pan (and the fluid therein) by an insulator assembly, generally designated 64.

The precise structure of each of the insulator assemblies 64 is disclosed in detail in application Ser. No. 953,575, noted above. However, for present purposes, it is sufficient to understand that each of the insulator assemblies 64 comprise a pair of co-axial tubes, the inner tube (not shown) being made of TEFLON (Dupont registered trademark) and the outer tube 65 being made of aluminum. The tubes are held in place by TEFLON bushings 66, having a central aperture therein such that the coil ends can pass therethrough and extend inside the inner tube.

The spray cooling method described herein permits easy and economical cooling of the reactor, thereby reducing deposition on the inner walls of the deposition enclosure 14. For this reason, the quality of the epitaxial crystal deposited is improved (by minimizing spikes, pits and surface defects), while at the same time tube maintenance is minimized, contamination of future runs by absorbed dopants is minimized and operating costs are reduced because gas cooling, water jackets, "black boxes" and exhaust systems are not required.

In the induction heated chemical vapor deposition reactor of the present invention, the reflector assembly 28 acts as a source of radiant heat which directly heats the outside surface of the wafer. The infrared reflector assembly redirects energy radiating outwardly from the induction coil, which normally would be unutilized, back towards the deposition enclosure so as to significantly reduce the input power requirements of the system. This permits a significantly larger load (susceptor) to be powered by conventional R.F. generators or standard size loads to be powered by R.F. generators of reduced capacity. Moreover, reduction of the input power requirements reduces the amount of high-cost electricity required to operate the reactor. In addition, the radiant heat focused by the reflectors on the wafer serves to more evenly heat the wafer to eliminate temperature gradients which result in material strain which, in turn, causes unwanted gross dislocation motion or slip.

While only a single preferred embodiment of the present invention has been disclosed herein for purposes of illustration, it is obvious that many variations and modifications could be made thereto. It is intended to cover all of these variations and mofidications which fall within the scope of the present invention, as recited in the annexed claims.

We claim:

1. A chemical vapor deposition reactor comprising the deposition enclosure having a substantially horizontal axis, said enclosure being adapted to receive a wafer mounted on a susceptor therein and having gas inlet and outlet ports, and induction coil comprising a plurality of spaced turns situated external to and surrounding at least a portion of said enclosure, an infrared reflector assembly mounted external to said enclosure with at least a portion of said coil interposed therebetween, said reflector redirecting and focusing energy toward said axis of said enclosure and comprising first and second concave parts with a space therebetween, said space extending in the direction substantially parallel to said axis, and means for preventing deposition of dopents on the surface of said enclosure, said deposition preventing means comprising means for spraying de-ionized liquid on said enclosure, said spray means being at least partially situated within said space between said reflector assembly.

* * * * *